United States Patent [19]

Rockett, Jr.

[11] Patent Number: 4,852,060
[45] Date of Patent: Jul. 25, 1989

[54] SOFT ERROR RESISTANT DATA STORAGE CELLS

[75] Inventor: Leonard R. Rockett, Jr., Washington, D.C.

[73] Assignee: International Business Machines Corporation, Armonk, N.Y.

[21] Appl. No.: 176,052

[22] Filed: Mar. 31, 1988

[51] Int. Cl.[4] ............................................. G11C 11/00
[52] U.S. Cl. .................................... 365/154; 365/156; 365/181; 365/190
[58] Field of Search ............... 365/154, 156, 181, 190, 365/205

[56] References Cited

U.S. PATENT DOCUMENTS

| | | | |
|---|---|---|---|
| 4,314,359 | 2/1982 | Kato et al. | 365/179 |
| 4,532,609 | 6/1985 | Iizuka | 365/154 |
| 4,545,036 | 10/1985 | Segers | 365/189 |
| 4,550,390 | 10/1985 | Akashi | 365/174 |
| 4,725,981 | 2/1988 | Rutledge | 365/154 |
| 4,782,467 | 11/1988 | Belt et al. | 365/154 |
| 4,797,804 | 1/1989 | Rockett, Jr. | 365/154 |

Primary Examiner—Joseph A. Popek
Attorney, Agent, or Firm—Jesse L. Abzug

[57] ABSTRACT

A CMOS data cell having increased immunity to single event upsets is disclosed. The cell includes a first CMOS inverter and a second CMOS inverter which have their respective storage nodes interconnected by cross-coupling connections. The respective storage nodes of the cell are connected through word line or write clock transfer gates to bit lines or data bus lines which serve to both write in and read out the data state of the cell. The soft error resistant data cell further includes six transistors which provide the hardening features to the data storage cell design. Two data state control transistors (one for each storage node) have their drain electrodes connected to a data storage node and their source electrodes connected to the power supply rail. Each of the data state control transistors is gated by the word line voltage via a transfer device or pass transistor that is in turn, gated by the complementary storage node on the opposite side of the cell. The gate electrode of each of the two data state control transistors is also connected to the drain electrode of a transistor of a cross-coupled transistor pair. Each of two transistors of this cross-coupled transistor pair has its gate electrode cross-coupled to the drain electrode of the other transistor and its source electrode connected to the power supply rail.

4 Claims, 6 Drawing Sheets

FIG. 9. HARDENED CMOS DATA CELL WITH TWO ACTIVE HIGH WRITE CLOCKS (WC1 AND WC2)

FIG. 10. HARDENED CMOS DATA CELL WITH TWO ACTIVE LOW WRITE CLOCKS (WC1 AND WC2)

SOFT ERROR RESISTANT DATA STORAGE CELLS

BACKGROUND OF THE INVENTION

1. Technical Field

The invention disclosed herein broadly relates to transistor circuits and more particularly relates to protective circuits for preserving the stored binary state of a transistor circuit storage device providing immunity to single event upsets.

2. Background Art

As the number of devices in a very large scale integrated (VLSI) circuit chip surpasses $10^5$, the individual transistor devices which form its component elementary logic circuits, occupy areas of the chip on the order of a few square microns. The quantity of charge which is transferred between field effect transistor devices of this size while carrying out normal switching operations, in on the order of 0.1 picoCoulombs ($10^{-12}$ Coulombs), making them very susceptible to electrostatic perturbations.

One ubiquitous source of such perturbations is cosmic rays, a highly penetrating radiation apparently reaching the earth in all directions from outer space. The primary cosmic rays entering the earth's atmosphere are almost entirely composed of positively charged atomic nuclei which collide with air nuclei high in the atmosphere, forming showers of positively and negatively charged nuclear fragments called secondary cosmic rays. These secondary cosmic rays penetrate all matter at the earth's surface and as they pass through a material object, they undergo collisions with electrons and nuclei of which the material is composed, leaving a track of electrostatic charge along the way. The linear charge density along such a track can be typically 0.3 picoCoulombs per micron, which is on the same scale as the quantity of charge involved in the switching operation of a single field effect transistor on a VLSI chip.

This becomes a significant problem in latch circuits composed of such devices, since a latch must sense and reliably store a binary bit of information for intervals measurable in millions of machine cycles. When data latches, or data storage cells, are struck by cosmic ray particles while storing information, they may experience soft errors, or single event upsets. These soft errors result from the collection of cosmic ray particle-induced excess charge at the data node of the latch which causes the stored data to change state. The altered data produces an error when detected at the output of the circuit. In order to better understand this problem, reference will be made to a typical integrated circuit field effect transistor latch and the mechanism of its response to an electrostatic perturbation such as a cosmic ray, will be discussed.

To begin this description, several terms need to be defined and suitable abbreviations established. The N channel field effect transistor circuit technology will be the example used herein. The abbreviation NFET will be used herein to refer to an N channel field effect transistor device. Such devices are generally fabricated by forming an N-type conductivity source diffusion and N-type drain diffusion in the surface of a P-type conductivity silicon substrate. The channel region of the substrate separating the source and drain regions, is covered by a gate insulator layer and a gate electrode. An enhancement mode NFET is normally nonconducting between its source and drain and it can be switched into conduction by applying a positive potential to its gate electrode, with respect to the potential of its source. A depletion mode NFET is normally conducting between its source and drain and it can be switched into nonconduction by applying a negative potential to its gate electrode, with respect to the potential of its source.

The abbreviation PFET will be used herein to refer to a P channel field effect transistor device. Such devices are generally fabricated by forming P-type conductivity source diffusion and P-type conductivity drain diffusions within an N-type conductivity diffusion called an N-well which, in turn, has been formed in the P-type semiconductor substrate for the integrated circuit. The channel region of the N-well separating the P-type source and drain diffusions is covered by the gate insulator layer and the gate electrode. An enhancement mode PFET is normally nonconducting between a source and drain when the gate-to-source potential is relatively negative, the opposite condition from that obtaining from an NFET device relative biasing.

One prior art approach to solving the single event upset problem for N channel enhancement mode/depletion mode flip-flop storage cells is described in U.S. Pat. No. 4,638,463 to L. R. Rockett, entitled "Fast Writing Circuit for a Soft Error Protected Storage Cell," issued Jan. 20, 1987 and assigned to the assignee of this invention. The principle of operation of the circuits disclosed in this earlier patent work well for enhancement mode/depletion mode circuit technology, however the problem of reducing the effect of single event upsets on complementary MOS (CMOS) circuits still remains significant. As used herein, CMOS refers to integrated circuits which employ both PFET and NFET devices connected so as to provide high speed, low power dissipation, integrated circuits for logic and memory applications.

Another prior art approach to reducing the effect of a single event upset in disturbing the stored state in an NFET flip-flop storage cell, is to provide a resistive element in the cross-coupling connection between the respective storage nodes of the cell. The purpose of the resistive element is to prevent the flow of charge from one node to the other node during the single event upset condition, thereby reducing the chances that the state of the cell will be disturbed. However, a significant disadvantage of such a prior art configuration is the reduction in the speed of operation of the flip-flop storage cell during normal write mode operations. The presence of the resistive device will increase the amount of time necessary to change the state of the flip-flop cell from a first binary state to a second binary state by flowing current from one node to the other node. Also, the inclusion of resistive elements in the latch design significantly increases the fabrication process complexity. It is these problems which are addressed by the invention disclosed and claimed herein.

OBJECTS OF THE INVENTION

It is therefore an object of the invention to provide an improved means for protecting a data storage cell from soft errors.

It is another object of the invention to minimize the effect of cosmic rays, alpha particles and other ionizing radiation on an integrated circuit data storage cell.

It is another object of the invention to provide an improved technique for minimizing the effects of single event upsets in CMOS circuits, which does not adversely impact the speed of operation of the circuit during normal conditions and does not significantly increase the power dissipated by the circuit.

It is still a further object of the invention to provide an improved technique for minimizing the effects of single event upsets in CMOS circuits, which does not require additional integrated circuit fabrication steps and which does not introduce any complexities into the integrated circuit fabrication process.

SUMMARY OF THE INVENTION

These and other objects, features and advantages of the invention are accomplished by the soft error resistant data cell disclosed herein. The disclosed data cell can withstand cosmic ray single particle hits without logic upset. That is, the disclosed cell exhibits hardness against upset. This hardness against upset is achieved solely by virtue of the design of the data cell and therefore no fabrication process or design groundrule development is required. Additionally, the hardness against upset is achieved without any deleterious effect on the normal speed and operation of the data cell and with no significant increase in the power dissipated by the data cell.

The data cell disclosed herein is a CMOS latch having a first CMOS inverter and a second CMOS inverter which have their respective storage nodes interconnected by cross-coupling connections. The respective storage nodes of the cell are connected through word line or write clock transfer gates (heretofore referred to as clocked word line transistors) to bit lines or data bus lines which serve to both write in and read out the data state of the cell. The soft error resistant data cell further includes six transistors which provide the hardening features to the data storage cell design. These six transistors are connected as follows. Two transistors (one for each storage node) have their drain electrodes connected to a data storage node and their source electrodes connected to the power supply rail. These two transistors heretofore will be referred to as data state control transistors. Each of the data state control transistors is gated by the word line voltage via a transfer device or pass transistor that is in turn, gated by the complementary storage node on the opposite side of the latch. The gate electrode of each of the two data state control transistors is also connected to the drain electrode of a transistor of a cross-coupled transistor pair. Each of the two transistors of this cross-coupled transistor pair has its gate electrode cross-coupled to the drain electrode of the other transistor and its source electrode connected to the power supply rail.

Figure 1:
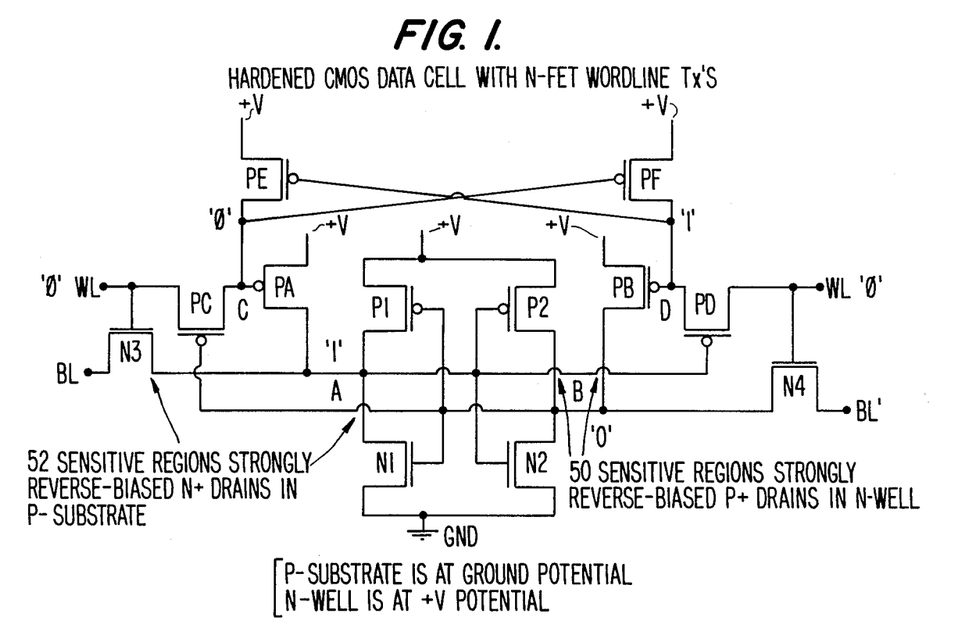
FIG. 1 is a schematic circuit diagram of the invention showing the soft error resistant data storage cell with NFET word line transistors in a steady state condition.
Figure 2:
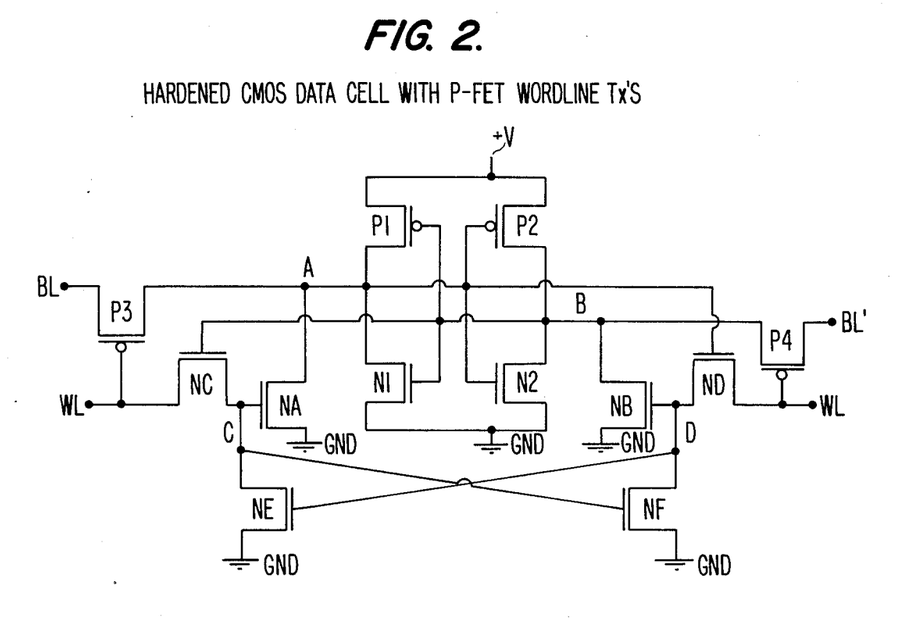
FIG. 2 is a schematic circuit diagram of the invention showing the soft error resistant data storage cell with PFET word line transistors.

FIG. 1 shows the circuit schematic representing one embodiment of the disclosed soft error resistant data storage cell. This first embodiment is the soft error resistant data storage cell with NFET word line transistors consistent with an active high word line clock voltage requirement (i.e., a positive-going clock signal voltage) to turn the word line transistors ON to write or read the stored data on the latch. FIG. 2 shows the circuit schematic representing a second embodiment of the disclosed soft error resistant data storage cell. The second embodiment is the soft error resistant data storage cell with PFET word line transistors consistent with an active low word line clock voltage requirement (i.e., a negative-going clock signal voltage) to turn the word line transistors ON to write or read the stored data on the latch.

In normal operation, when the word line transistors are OFF (i.e., not conductive) and the data storage cell is storing information such that one side of the latch is at a high binary data state and the opposite side of the latch is at a low binary data state, the six hardening transistors of the soft error resistant data cell design are themselves set in such a way as to reinforce the data state of the latch. This reinforcement of the data state of the latch provides the latch with the hardness necessary to withstand the most intense cosmic ray particle strike without logic upset or loss of information. No DC current paths exist in the design so the soft error protection is gained with no significant increase of power dissipation.

When the word line transistors are clocked ON (i.e., conductive) in order to write data into the latch or to gain read access to the data stored on the latch, the data state control transistors are simultaneously turned OFF, thereby off-loading the data storage cell so that the data storage cell can respond in a fast, undeterred fashion. The speed of the data cell is not adversely impacted by the presence of the six hardening transistors since when the cell is accessed during a write or read operation the effective loading of the hardening transistors is simultaneously removed. Thus the overall performance of the disclosed soft error resistant data storage cell is unaffected by its inherent hardening features.

BRIEF DESCRIPTION OF THE DRAWINGS

The features and advantages of the invention will be more fully appreciated with reference to the accompanying figures. The figures that contain a schematic circuit diagram assume a P-type substrate which is grounded and an N-type well which is tied to the +V potential.

DESCRIPTION OF THE BEST MODE FOR CARRYING OUT THE INVENTION

Referring now to FIG. 1, the invention is shown for a soft error resistant data cell with NFET word line transistors in steady state condition. The circuit is a CMOS flip-flop data storage cell comprising a first inverter portion having the PFET device Pl and NFET device N1 mutually connected to a first storage node A. Storage node A is connected through a word line NFET transfer device N3 to the bit line BL. Similarly, a second CMOS inverter is shown in FIG. 1 with the PFET device P2 and the NFET device N2 connected to the second storage node B. The second storage node B is connected through a second NFET transfer device N4 to the second bit line BL'. The gates of the PFET device Pl and the NFET device N1 are connected in common and are connected to node B. The gates of PFET device P2 and the NFET N2 are connected in common and are connected to node A. The first inverter is connected between the +V potential and ground and the second inverter is also connected between the +V potential and ground, as shown in FIG. 1.

The soft error resistant data cell shown in FIG. 1 has six additional transistors which provide the hardening features to the data storage cell design. These six transistors are all PFET devices and are connected as follows. The two transistors PA and PB have their drain electrodes connected to data storage nodes A and B, respectively. Devices PA and PB have their source electrodes connected to the +V potential. These two transistors, PA and PB in FIG. 1, will be referred to as data state control transistors. The data state control transistors PA and PB are gated by a clocked word line signal voltage, labeled WL in FIG. 1, via pass transistors PC and PD, respectively. Devices PC and PD are, in turn, gated by the complementary storage node on the opposite side of the latch, that is, node B and node A, respectively. The gate electrode of each of the two data state control transistors PA and PB is also connected to the drain electrode of a transistor of a cross-coupled pair comprising devices PE and PF, respectively. These cross-coupled transistors, PE and PF, each have their gate electrode connected to the drain electrode of the other transistor, node D and node C, respectively. Devices PE and PF have their source electrodes connected to the +V potential.

In the circuit environment shown in FIG. 1, the first binary data state is associated with a relatively positive potential at node A, indicated by '1', and a zero potential at node B, indicated by '0'. During this steady state condition, no enabling signal is applied to the word line WL and therefore the zero potential applied to the transfer gates N3 and N4 renders those devices in a nonconductive state. With node A at the relatively positive potential and node B at zero potential, device PC is ON and device PD is OFF. Further, with the word line WL at zero potential and with PC ON, node C is at zero potential and thus PA and PF are both ON. With device PA ON, the relatively positive data state at node A is reinforced, hardening the latch against single event upsets. With PD OFF and PF ON, node D is at a relatively high potential so that devices PB and PE are both OFF. No DC current paths exist in the design of the soft error resistant data cell so that there is no significant increase in the power dissipated by the circuit. (FIG. 2 shows a schematic circuit diagram of the invention showing the soft error resistant data storage cell with PFET word line transistors.)

Figure 3:
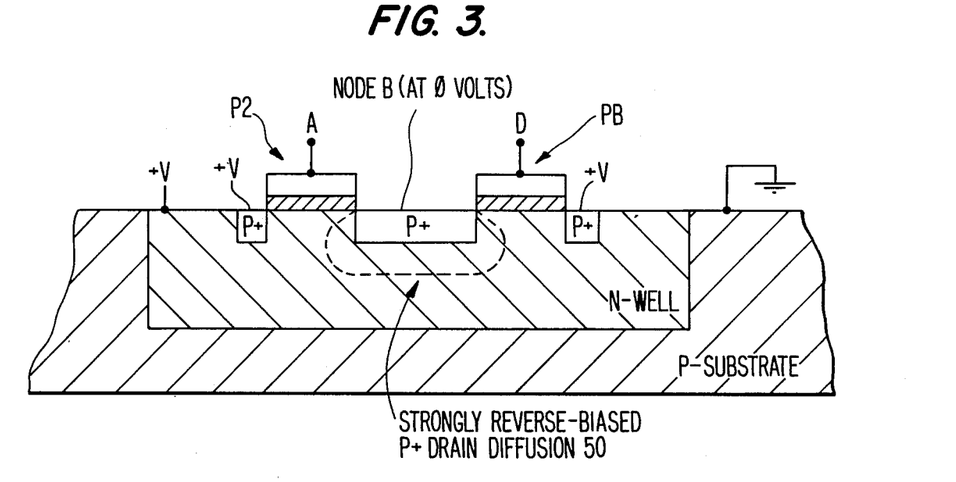
FIG. 3 is a cross-sectional diagram of the structure of P channel FET devices P2 and PB, illustrating its strongly reverse-biased drain diffusion, during the steady state condition shown in FIG. 1.

It is instructive to understand that there are sensitive regions associated with reverse-biased diffusions in the circuit, which are readily discharged during a single event upset condition. FIG. 3 illustrates the PFET devices P2 and PB which are positioned in an N-well which is positively biased to +V potential. In the storage state shown in FIG. 1, the drain diffusion 50 of the PFET devices P2 and PB is strongly reverse-biased because the node B is at zero potential causing the diffusion 50 to be at zero volts potential whereas the N-well surrounding the diffusion 50 is at +V volts potential. When a cosmic ray particle or other ionizing radiation particle causes the production of electron-hole pairs in the vicinity of the drain diffusion 50, the electrons are attracted to the relatively positively biased N-well whereas the holes are attracted to the relatively negatively biased drain diffusion 50. A cosmic ray particle strike at drain diffusion 50 could deposit up to 7 picoCoulombs of excess charge having approximately a 0.1 nanosecond duration. This excess charge collection at drain diffusion 50 would cause an abrupt positive-going voltage transition potentially causing a disturbed data condition.

Figure 4:
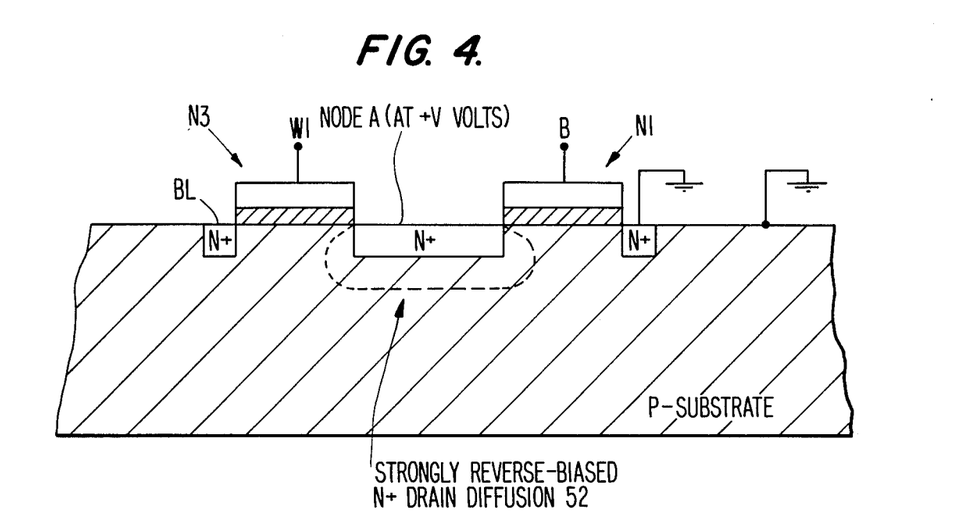
FIG. 4 is a cross-sectional diagram of the structure of N channel FET devices N1 and N3, illustrating their strongly reverse-biased drain diffusion, during the steady state condition shown in FIG. 1.

Another sensitive region in the circuit of FIG. 1 is the N-type drain diffusion for the NFET devices N1 and N3. Typically, these devices will be built as is shown in FIG. 4 into a P-type substrate held at ground potential. The devices share a common drain diffusion 52 which is biased at +V volts in the binary storage state shown in FIG. 1. At the same time, the P-type substrate within which the drain diffusion 52 is formed is biased at ground potential. This creates a strongly reverse-biased drain diffusion 52. If a single event upset condition occurs in the vicinity of the drain diffusion 52, the electron-hole pairs produced by that event will disturb the steady state condition of the drain diffusion 52. Holes which are produced by the single event upset condition will be attracted to the relatively negatively biased P-type substrate whereas the electrons produced by the event will be attracted to the relatively positively biased N-type drain diffusion 52. A cosmic ray particle strike at drain diffusion 52 could deposit up to 7 picoCoulombs of excess charge having approximately a 0.1 nanosecond duration. This excess charge collection at drain diffusion 52 would cause an abrupt negative-going voltage transition potentially causing a disturbed data condition.

Figure 5:
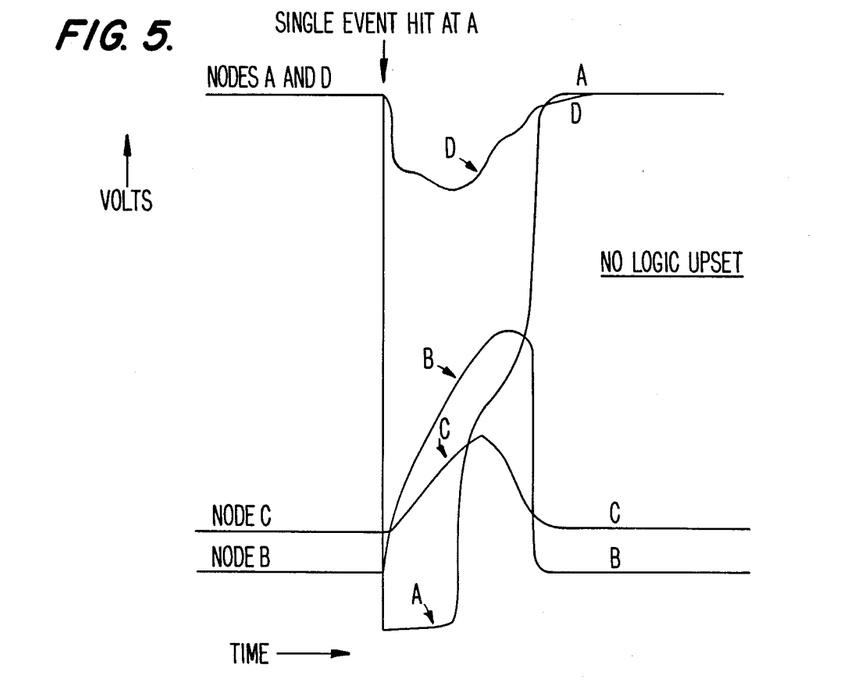
FIG. 5 illustrates voltage waveforms associated with the respective data storage cell nodes of the invention during a potential single event upset condition at node A of the circuit shown in FIG. 1.

Generally, it is when data storage cells are storing data and not being actively written that they are susceptible to single particle induced upsets. Again, the regions of data storage cells that are sensitive to single particle hits are the strongly reverse-biased circuit nodes. Let us now examine how the disclosed soft error resistant data storage cell is hardened against single particle upsets. Referring to FIG. 1, the steady state condition shown has nodes A and D high and nodes B and C low, the sensitive regions of this cell design are the strongly reverse-biased N+ diffusion region at A and the strongly reverse-biased P+ diffusion regions at B and C. The P+ diffusion region at node D is not strongly reverse-biased and thus, for the steady state condition shown in FIG. 1, does not represent a single event upset sensitive region. As previously described, an intense cosmic ray particle hit in the vicinity of node A would cause a momentary negative voltage transient while hits in the vicinity of nodes B or C would cause a momentary positive voltage transient. Consider first an intense hit to node A. The hit at node A occurs and node A instantaneously goes low and thus momentarily the cell is instable with both A and B at a relatively low potential. Device PD momentarily turns ON but node D cannot charge low enough to turn PB fully ON since device PF remains ON. However the presence of the fully ON PA device, reinforcing the pre-hit relatively positive data state at node A, restores node A to its pre-hit data state. Therefore node A recovers without logic upset. FIG. 5 illustrates voltage waveforms associated with the respective data storage cell nodes of the invention, illustrating their behavior during a potential single event upset condition due to a cosmic ray particle strike at node A of the circuit shown in FIG. 1.

Figure 6:
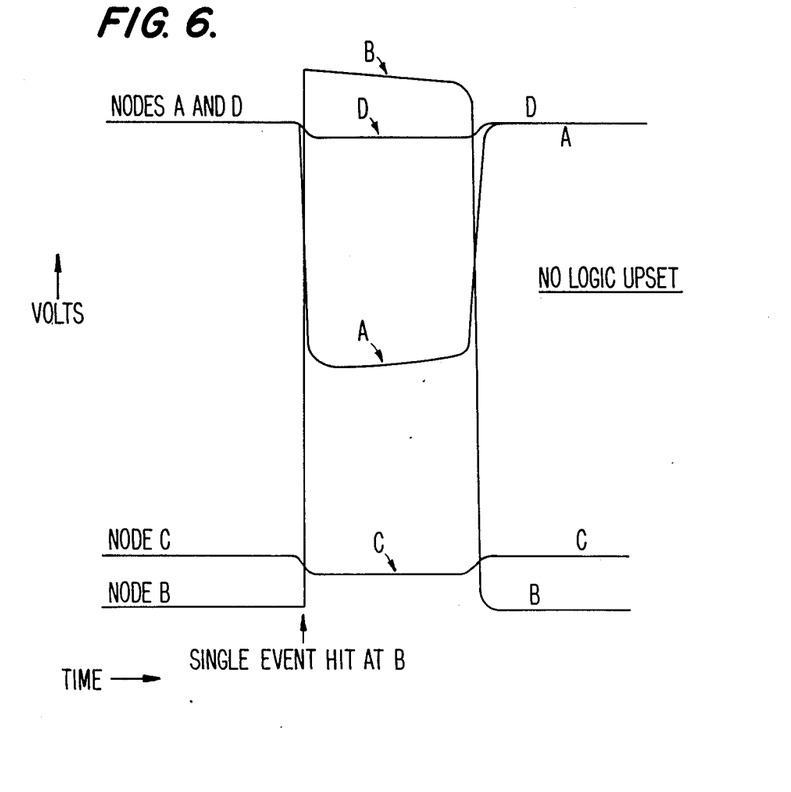
FIG. 6 illustrates voltage waveforms associated with the respective data storage cell nodes of the invention during a potential single event upset condition at node B of the circuit shown in FIG. 1.

Consider now an intense hit occurring at node B. When the hit occurs at node B, node B instantaneously goes high turning device PC OFF, momentarily isolating node C at its relatively low potential. With the gate electrodes of devices P1 and N1 connected to node B, the resulting data cell feedback response causes node A to attempt to go low. However, with device PA ON reinforcing the preexisting high data state at node A, node A maintains its relatively positive data state and therefore node B eventually returns to its pre-hit low potential after the momentary disturbed condition subsides and device N2 once again pulls node B low. Thus node B recovers without logic upset. FIG. 6 illustrates voltage waveforms associated with the respective data storage cell nodes of the invention, illustrating their behavior during a potential single event upset condition due to a cosmic ray particle strike at node B of the circuit shown in FIG. 1.

Figure 7:
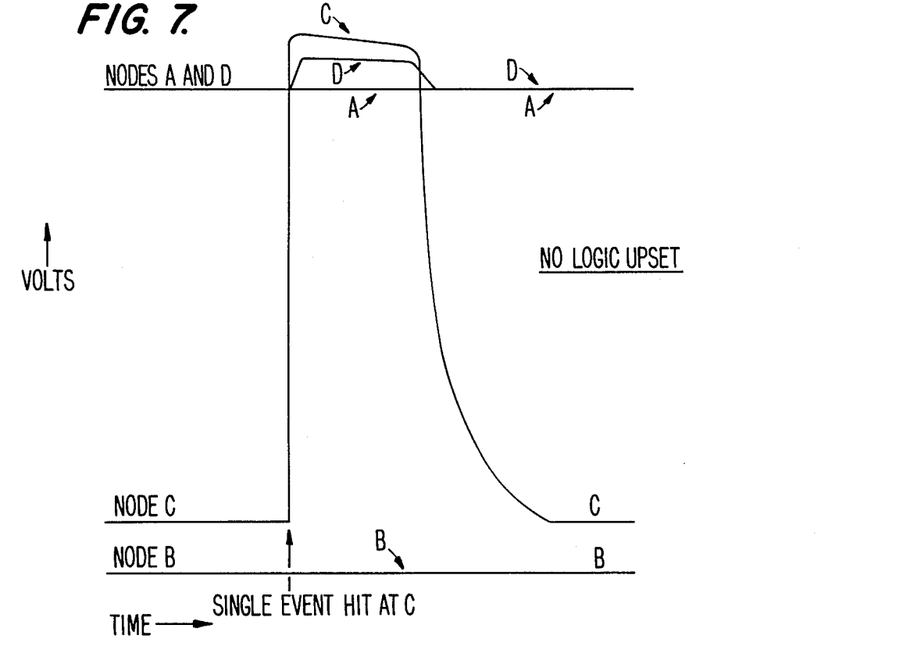
FIG. 7 illustrates voltage waveforms associated with the respective data storage cell nodes of the invention, during a potential single event upset condition at node C of the circuit shown in FIG. 1.

Finally, a hit at node C causes devices PA and PF to turn OFF momentarily. With respect to the data information stored in the data cell, no harm is done and node C is eventually recharged low through the ON PC device. Node C recovers and there is no threat posed to the stored data. There is no logic upset. FIG. 7 illustrates voltage waveforms associated with the respective data storage cell nodes of the invention, illustrating their behavior during a potential single event upset condition due to a cosmic ray particle strike at node C of the circuit shown in FIG. 1.

Similar dynamics are at work to harden the soft error resistant data storage cell of FIG. 1 when the opposite data state is initially stored in the cell. Similar descriptive analyses can be offered concerning the operation and the effectiveness of the soft error resistant data storage cell of FIG. 2. Again, these hardening dynamics apply no matter what data condition is stored in the cell and in this way the disclosed soft error resistant data storage cells are completely single event upset immune. Actual cyclotron testing performed on data latch strings designed and built with the data storage cell design of FIG. 1 showed that no logic upsets occurred during these tests which included the exposure of the latch strings to the most intense cosmic ray particle beam. These tests verified the effectiveness of the disclosed soft error resistant data storage cell in preventing single event upsets.

Figure 8:
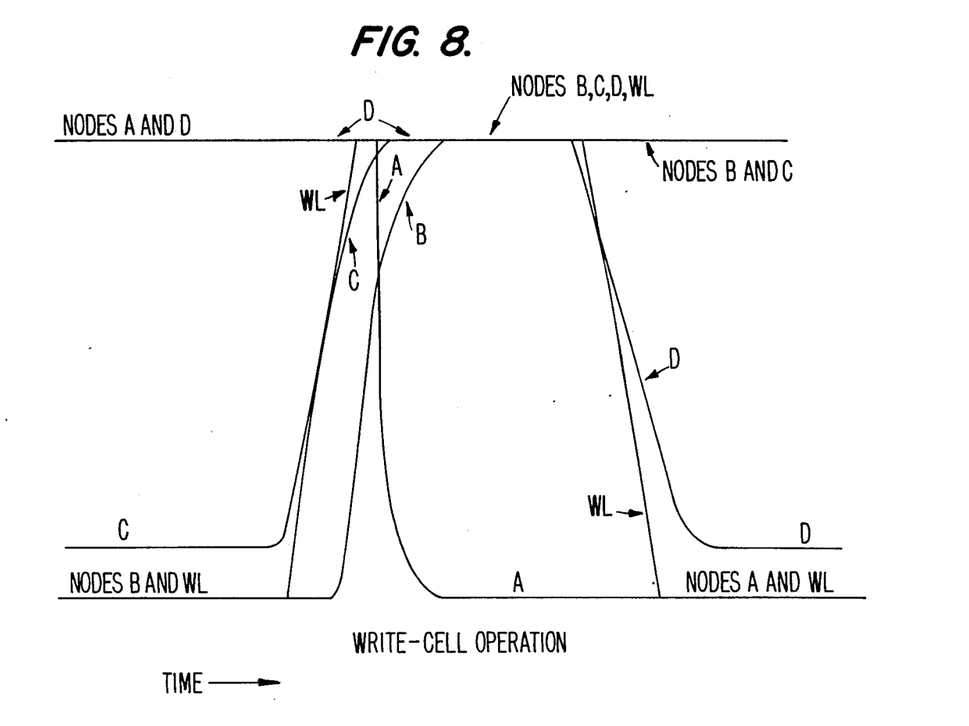
FIG. 8 illustrates voltage waveforms associated with the respective data storage cell nodes of the invention during a write cell operation.

Although the circuit of FIG. 1 is protected from the effects of a single event upset, the circuit still provides high speed operation for normal writing of the data cell. Let us now examine a write-cell operation on the data cell of FIG. 1. Consider initially the data state shown in FIG. 1. FIG. 1 shows that the data cell initially stores data such that data node A is at a high potential level, data node B at a low potential, and the word line is OFF, that is WL is low, so that node C is low and node D is high. In steady state, there are absolutely no DC current paths in the design. Let us examine the write-cell operation dynamics that occur in writing the data cell of FIG. 1 from this initial state as depicted in FIG. 1 to its opposite binary data state. First, assume that the bit lines (BL and BL') are driven (conventionally, by input data buffers and/or write circuitry (not shown)) in such a way that the cell will change state when the word line is activated turning the word line transistors ON. That is, BL is set low and BL' is high. When the word line is activated, that is, goes high, the NFET word line transistors (N3 and N4) turn ON allowing access to the data storage cell. Simultaneously, as the WL is activated, node C is discharged high through the ON device PC, turning device PA OFF. In this way the data cell is off-loaded, that is, devices PB and now PA are both OFF removing all extra current loading on the data nodes A and B thus allowing the data storage cell to be written in its characteristically fast, undeterred fashion. The data cell is written and consequently node A is set low and node B is set high. With node A now low, device PD is ON. With node B now high, device PC is OFF. At the completion of the write-cell operation the word line is then deactivated, that is, WL goes low, and now node D charges low through the ON device PD. Node C remains high since device PC is OFF. With node D low, device PE is ON keeping node C high and device PB is ON reinforcing the high data state at node B, thereby hardening the data cell against single particle induced upsets. FIG. 8 illustrates voltage waveforms associated with the respective data storage cell nodes of the invention, illustrating their behavior during a write-cell operation.

Figure 9:
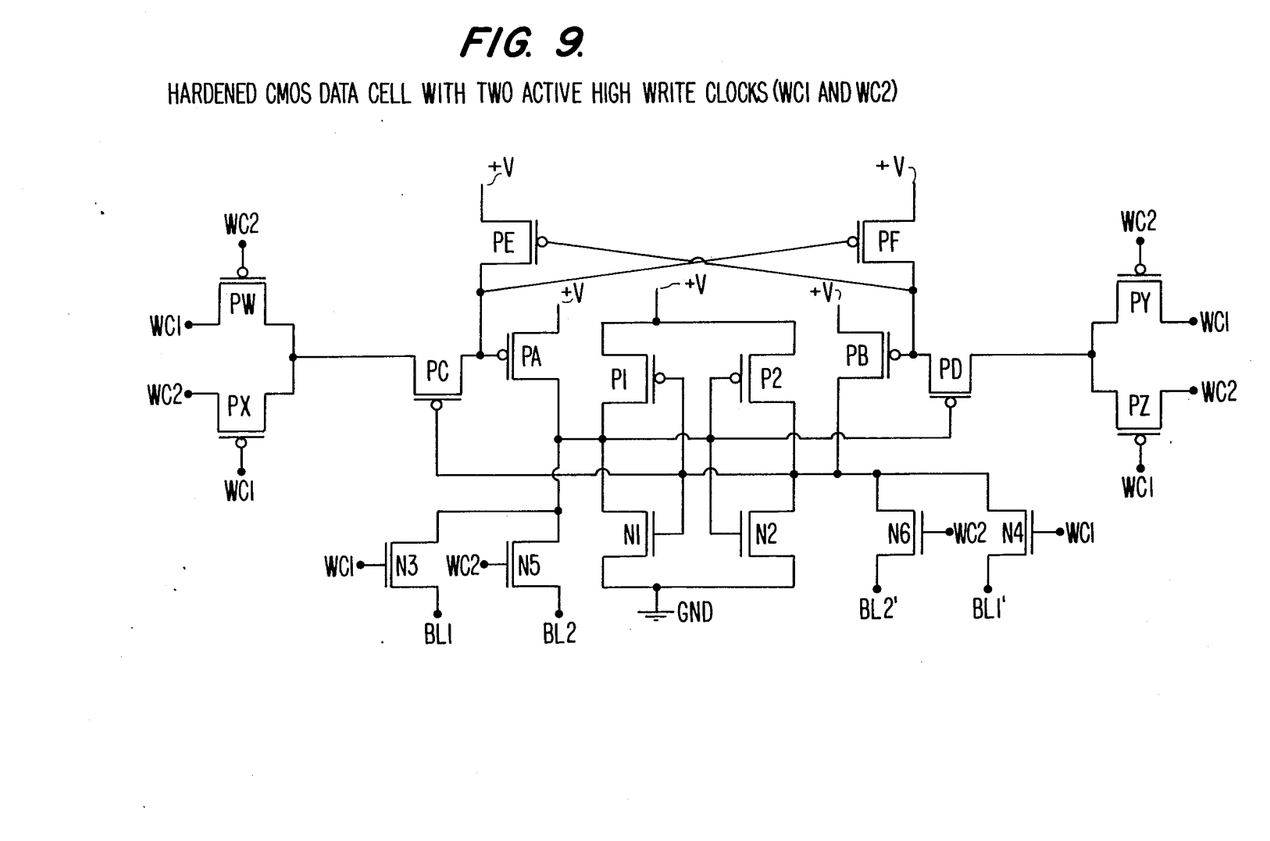
FIG. 9 is a schematic circuit of one embodiment of a soft error resistant CMOS data latch with two active high write clocks (WC1 and WC2).
Figure 10:
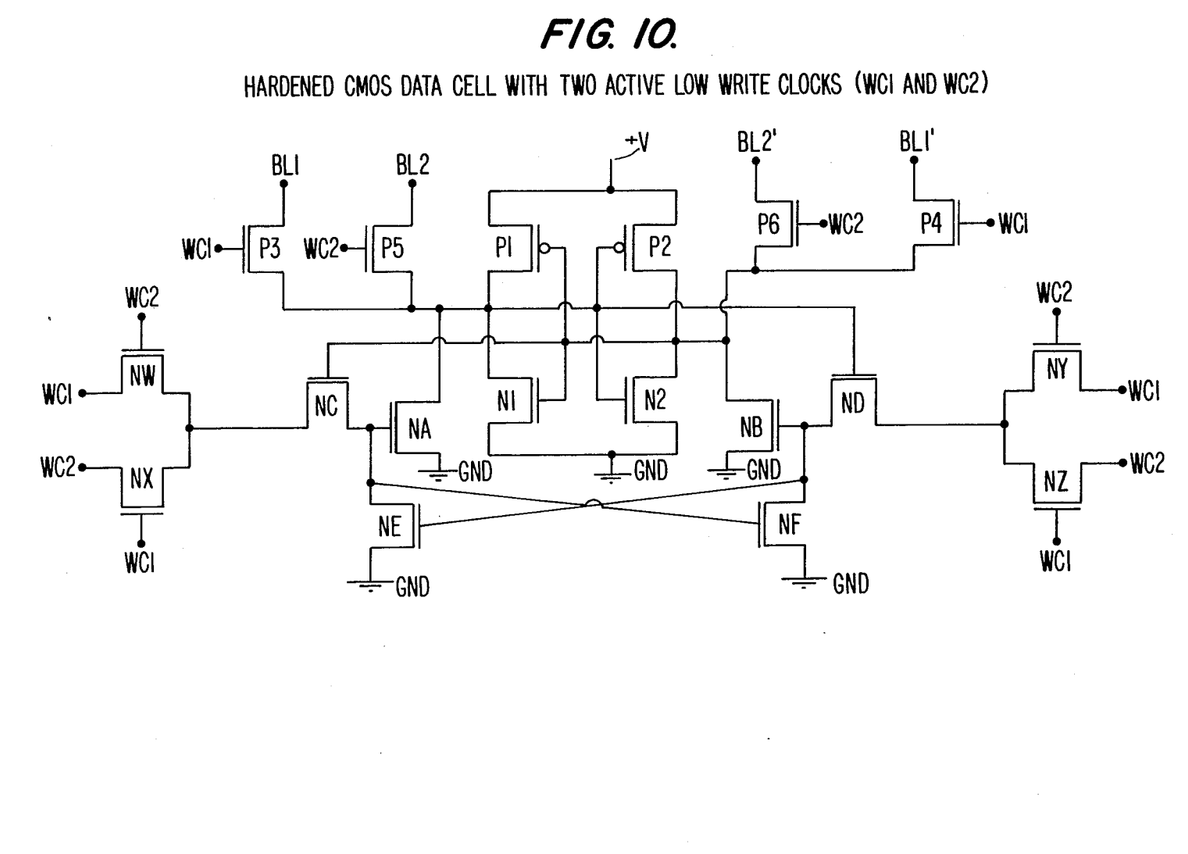
FIG. 10 is a schematic circuit of one embodiment of a soft error resistant CMOS data latch with two active low write clocks (WC1 and WC2).

The soft error resistant data storage cell designs shown in FIG. 1 and FIG. 2 have shown two possible embodiments of the invention for data storage cells which are controlled by only one write clock or word line signal. For data storage cells that utilize two separate write clocks (e.g., a scan data clock and a system data clock, neither of which can be ON at the same time as the other) the circuit schematic diagrams of FIG. 9 and FIG. 10 show two possible embodiments. FIG. 9 is a schematic circuit of one embodiment of a soft error resistant CMOS data latch with two active high write clocks (WC1 and WC2). FIG. 10 is a schematic circuit of one embodiment of a soft error resistant CMOS data latch with two active low write clocks (WC1 and WC2). For data cells that require more than two separate clocks, extensions to the disclosed soft error resistant data cell design concepts are realizable and will still fall under the spirit and the scope of this invention.

The disclosed soft error resistant data storage cell designs are the most effective means to hardening data storage cells (e.g., static RAM cells, data latches) against single particle induced upsets. The disclosed designs are soft error resistant, single event upset immune. Furthermore, the soft error resistant data cell design concepts have very little impact on the normal circuit speed and response times. The features of the disclosed soft error resistant data cell designs which make it the preferred choice over any other single event upset hardening techniques include the following: (1) the disclosed cell provides the maximum level of hardness at little cost to cell performance; (2) the hardness of the disclosed cell is derived strictly from the cell design, thus no process or design groundrule development is needed; (3) analyses have shown that the hardness of the disclosed cell is insensitive to environmental temperature variations as well as device threshold voltage shifts; and (4) cyclotron tests have verified the effectiveness of the disclosed cell. Again, the soft error resistant data cell design approach has relatively little adverse impact on the cell performance and power dissipation. Finally, the disclosed cell design concepts are fully extendable to any data cell design requirement.

Although specific embodiments of the invention have been disclosed, it will be understood by those having skill in the art that minor changes can be made to the specific embodiments without departing from the spirit and the scope of the invention.

What is claimed is:

1. In a data cell comprising a first inverter having a first storage node and a second inverter having a second storage node, said first and second inverters having their respective storage nodes cross-coupled, and each of said storage nodes connected through transfer gates to data lines, the improvement comprising a circuit for increasing the resistance of said data cell to single event upsets including:

two data state control devices, each of said data state control devices having one of its current conducting electrodes connected to a storage node and the other of its current conducting electrodes connected to a power supply, each of said data state control devices being gated by a word line signal through respective pass devices, the gate of each of said data state control devices also connected to a current conducting electrode of a cross-coupled device pair, each of the devices in said pair having its gate cross-coupled to a current conducting electrode of the other device in said pair, and the other current conducting electrode of each device connected to the power supply, and each of said pass devices being gated by the complementary storage node of said data cell;

whereby the immunity of said data cell to single event upsets at each of said storage nodes will be increased.

2. The data cell as claimed in claim 1 wherein said data state control devices, said pass devices and said cross-coupled device pair are PFET devices.

3. The data cell as claimed in claim 1 wherein said data state control devices, said pass devices and said cross-coupled device pair are NFET devices.

4. The data cell as claimed in claim 1 wherein said first and second inverters are CMOS inverters.

* * * * *